United States Patent [19]

Daniel, Jr.

[11] 3,831,037

[45] Aug. 20, 1974

[54] PARAMETRIC AMPLIFIER HAVING AN IDLER CIRCUIT REDUCING SPURIOUS IDLER SIGNAL MAGNITUDE

[75] Inventor: James Walter Daniel, Jr., Cherry Hill, N.J.

[73] Assignee: RCA Corporation, New York, N.Y.

[22] Filed: Sept. 27, 1973

[21] Appl. No.: 401,211

[52] U.S. Cl. .................................. 307/88.3, 330/4.9
[51] Int. Cl. .................................................. H03f 7/04
[58] Field of Search .............. 307/88.3; 330/4.9, 4.8

[56] References Cited

UNITED STATES PATENTS 3,388,263 6/1968 Daniel.................................. 330/4.9

*Primary Examiner*—Herman Karl Saalbach
*Assistant Examiner*—Darwin R. Hostetter
*Attorney, Agent, or Firm*—Edward J. Norton; Joseph D. Lazar; Donald E. Mahoney

[57] ABSTRACT

The magnitude of spurious idler signals in a parametric amplifier is reduced by use of an idler circuit which impedes the circulation of currents at undesired idler frequencies.

4 Claims, 1 Drawing Figure

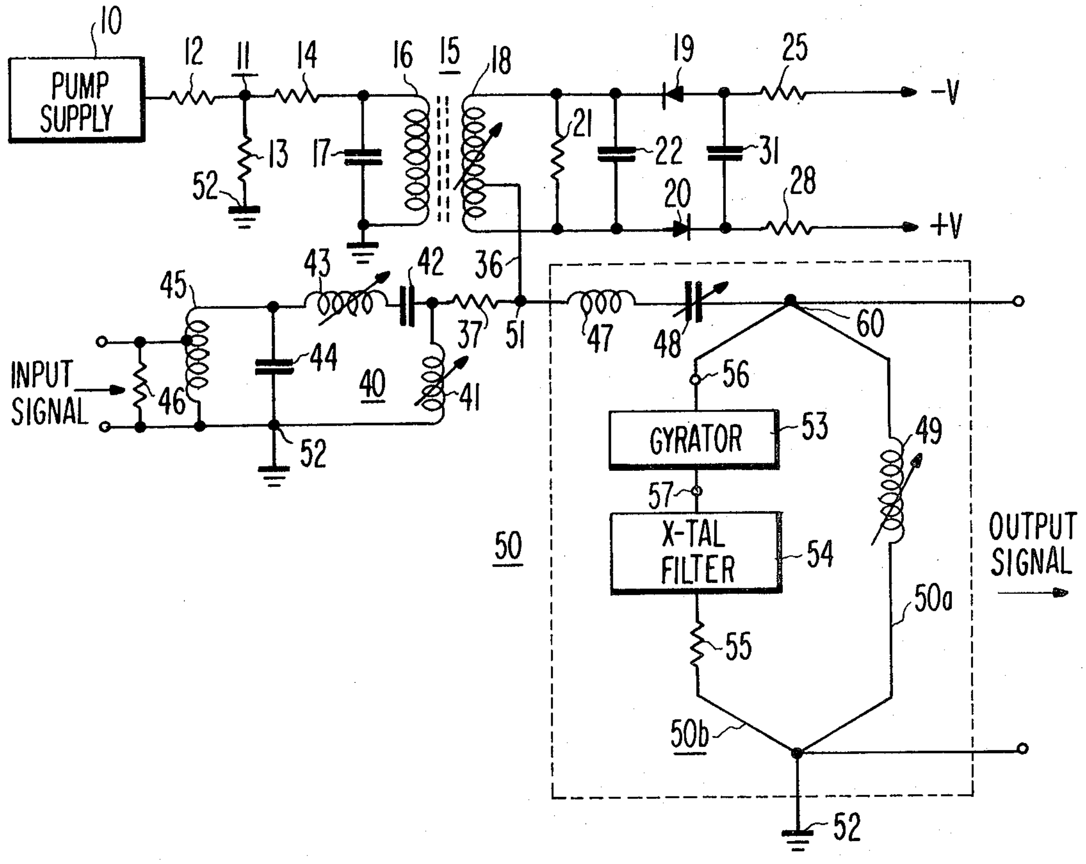
PUMP SUPPLY
GYRATOR
X-TAL FILTER
INPUT SIGNAL
OUTPUT SIGNAL
-V
+V

PARAMETRIC AMPLIFIER HAVING AN IDLER CIRCUIT REDUCING SPURIOUS IDLER SIGNAL MAGNITUDE

BACKGROUND OF THE INVENTION

1. Field of the Invention

This invention relates to parametric up-converters and more particularly to parametric up-converters having a fine tuned idler circuit.

2. Description of the Prior Art

A parametric amplifier or up-converter is a circuit in which a time-varying, non-linear reactance element, such as a varactor diode, is used to mix two signals of different frequencies $f_1$ and $f_2$ producing a series of frequencies including (among others) the sums and differences of the two applied signal frequencies. Thus, an upper-sideband up-converter furnishes a signal at a frequency, $f_3$, equal to the sum, $f_1+f_2$, of the two applied signal frequencies. While, a lower-sideband up-converter furnishes a signal at an idler frequency, $f_3$, equal to the difference, $f_2-f_1$, of the two applied signal frequencies.

In practice a relatively high frequency signal, called the pump signal at frequency $f_2$, is coupled to a varactor diode through a pump circuit tuned to be resonant over a band of pump frequencies. The pump circuit matches the varactor diode impedance to the pump signal source impedance over the pump signal frequency bandwidth. The pump signal at frequency $f_2$ and an input signal at frequency $f_1$ are simultaneously coupled to the varactor diode. The input signal at frequency $f_1$ is coupled to the varactor diode through an input signal circuit tuned to be resonant over a band of input signal frequencies. The input signal circuit is arranged to match the varactor diode impedance to the input signal source impedance over the input signal frequency bandwidth. Generally, the input frequency $f_1$ is arranged to be lower than the pump frequency $f_2$. In a lower sideband parametric up-converter, a negative resistance is reflected into the input signal source resulting in input signal gain and a desirable increased conversion from energy at the pump frequency $f_2$ to energy at idler frequency $f_3$. An idler circuit which permits the flow of circulating currents through the varactor diode at idler frequency $f_3$ is necessary for parametric amplifier operation. The idler circuit also presents a desirable impedance to the non-linear reactance element which impedance is necessary for optimum gain at idler frequency $f_3$. One example of a parametric amplifier is described in U.S. Pat. No. 3,388,263, *AGC For Broadband Parametric Amplifier*, issued to James W. Daniel, Jr. on June 11, 1968.

In the prior art, undesirable spurious idler signals outside of the desired idler signal bandwidth are generated by a non-linear reactance element in response to undesirable input signals at frequencies near but outside of the permissable input signal frequency bandwidth. Under such conditions, the non-linear reactance element mixes the undesirable input signal and the pump signal to produce an undesired spurious idler signal which circulates in the prior art idler circuit discussed above.

A solution to the problem of the presence of such spurious idler signals provides for the attenuation of the undesirable input signals by increasing the number of filter stages in the input signal circuit. This proposal is not satisfactory when the amount or magnitude of attenuation needed for undesirable input signals at frequencies very close to the frequency of the permissable input signals such as third order intermodulation products would require an impractical number of input signal filter stages as discussed above. Another solution to the problem of spurious idler signals proposed heretofore is to transmit all idler signals through crystal filters resonant over the desired idler frequency bandwidth to attenuate spurious idler signals outside of the desired idler frequency bandwidth. This proposal is not entirely satisfactory since the prior art idler circuit still provides a path for circulating currents through the varactor at undesirable idler frequencies. Thus, undesired spurious idler signals were still amplified by the non-linear reactance element and thereby spurious signal amplification offset signal attenuation provided by the crystal filter.

SUMMARY OF THE INVENTION

A parametric amplifier comprises means for coupling a first signal, at frequency $f_1$, to a non-linear reactance element and means for coupling a second signal, at frequency $f_2$, to the element. The non-linear reactance element produces a third signal, at frequency $f_3$, when the first and second signals are concurrently applied. The parametric amplifier includes circuit means coupled to the element for circulating currents through the element at the third frequency $f_3$. The circuit means provide first and second signal paths to ground for the circulating currents. The first signal path is a relatively high impedance path to ground potential at the third signal frequency $f_3$ and a relatively low impedance path to ground potential at frequencies other than the third signal frequency $f_3$. The second signal path includes components tuned to resonate with the non-linear reactance element.

BRIEF DESCRIPTION OF THE DRAWING

The sole FIGURE of the drawing is a schematic diagram of an embodiment of a parametric amplifier circuit in accordance with the principles of this invention.

DESCRIPTION OF THE PREFERRED EMBODIMENT

Referring to the drawing, there is shown a schematic drawing of a parametric amplifier having an idler circuit 50 which substantially reduces the circulation of currents at undesirable spurious idler frequencies. Source 10 provides pump oscillations and may be a transistor oscillator circuit or a transistor oscillator circuit followed by a series of frequency multipliers in order to obtain a pump supply of the desired operating frequency, $f_2$, and amplitude. Source 10 known in the art is also termed a pump supply or pump oscillator. Pump supply 10 is coupled to a resistive T-network 11 which comprises resistors 12, 13 and 14. The function of network 11 is to provide an impedance match between pump oscillator 10 and primary winding 16 of transformer 15. The primary winding 16 of transformer 15 is tuned by a means of capacitor 17 to be resonant at pump frequency $f_2$. One end of the secondary winding 18 of transformer 16 is coupled to the cathode of a non-linear, variable capacitance diode 19, while its other end is coupled to the anode of another non-linear, variable capacitance diode 20. The function of the diodes or varactors 19 and 20 is to provide a variable capacitance which varies in accordance with the frequency $f_2$ of pump supply 10. As such, the varactors 19 and 20 are parametric elements. It is noted that other devices might be employed in lieu of diodes 19 and 20, such as hypershunt varactors, and similar parametric elements.

Shunted across secondary winding 18 is resistor 21 and capacitor 22. The function of capacitor 22 is to tune secondary winding 18 of transformer 15 to pump frequency $f_2$, while the function of resistor 21 is to slightly lower the Q of the resonant circuit formed by secondary wwnding 18 and capacitor 22 to prevent spurious ringing of this resonant circuit. The anode of varactor 19 is coupled to resistor 25 with the other end of resistor 25 being coupled to a source of negative potential ($-V$) which provides a bias potential for varactor diode 19. The cathode of varactor 20 is connected to one end of resistor 28 which is of the same order of magnitude as resistor 25. The other end of resistor 28 is coupled to a source of positive potential ($+V$) which serves as a biasing source for varactor diode 20. When pump supply 10 operates at frequency $f_2$ and supplies a peak pump voltage signal which exceeds both the bias voltage determined by resistors 25 and 28 and the sources of positive and negative potential (+V, −V), variable capacitance diodes 19 and 20 will start to conduct during that portion of the pump cycle when the anode of the respective diode is positive with respect to the cathode.

Connected from the anode of diode 19 to the cathode of diode 20 is a capacitor 31 which serves as a bypass capacitor. Capacitor 31 may be formed as two capacitors with their common terminal grounded to thus serve as a filter capacitor to provide self-bias for diodes 19 and 20. A double tuned circuit resonant at pump frequency $f_2$ is formed by the primary winding 16 in shunt with capacitor 17 and secondary winding 18 in shunt with capacitor 22 and resistor 21 previously discussed.

One terminal of resistor 37 is coupled to nodal point 51 and by lead 36 to a tap point preferably the center tap, on secondary winding 18 of transformer 15. The other terminal of resistor 37 is connected to the junction of variable inductor 41 and capacitor 42. The opposite terminal of variable inductor 41 is connected to a point of reference potential, such as ground 52. The other terminal of capacitor 42 is coupled to a terminal of another variable inductor 43. The other terminal of variable inductor 43 is coupled to one terminal of capacitor 44 and one terminal of inductor 45. The other terminals of capacitor 44 and inductor 45 are coupled together and are connected to a point of reference potential such as ground 52. Also shown coupled in shunt with a portion of inductor 45 is resistor 46.

Input signals, centered at frequency $f_1$, from a source, not shown, are coupled across the terminals of resistor 46 and thereby to the parametric amplifier shown in the drawing. The input signal may be provided from a source of frequencies such as an oscillator centered at frequency $f_1$. For use as a receiver, the terminals of resistor 46 are coupled to the terminals of the receiver antenna. Thus, for such use, resistor 46 serves to provide an impedance match between input signal circuit 40 and the receiver antenna element, not shown, in order to reduce the standing wave ratio presented to the input signals by input circuit 40.

The input signal circuit 40 just described is suitably a bandpass filter designed as a Butterworth circuit having elements arranged to accommodate a desired spectrum of frequencies centered at frequency $f_1$. The function of resistor 37 is to maintain the impedance of the signal circuit 40, as viewed by the variable reactance circuit including diodes 19 and 20 as constant as possible in order to prevent negative resistance from shunting the signal circuit 40 and causing the parametric amplifier to oscillate.

An output signal is developed across an idler circuit 50 coupled to lead 36 and nodal point 51 of the amplifier just described. Circuit 50 includes first (50*a*) and second (50*b*) signal paths between nodal point 60 to ground 52. Idler circuit 50 also includes a series connection of inductor 47 and capacitor 48 in which one terminal of inductor 47 is coupled to nodal point 51 and the other terminal of inductor 47 is coupled to one terminal of variable capacitor 48 whose other terminal is coupled to nodal point 60. Inductor 47 and capacitor 48 are tuned to be series resonant at idler frequency $f_3$. First signal path 50*a* from idler nodal point 60 to ground 52 is provided by connecting one terminal of variable inductor 49 to nodal point 60 and connecting the other terminal of inductor 49 to ground 52. The circuit comprising inductor 47, capacitor 48 and variable inductor 49 is an example of a prior art idler circuit usually tuned to the difference in frequency between the pump and signal frequencies when used as a lower-sideband parametric up-converter or to the sum of the signal and pump frequencies when used as an upper-sideband parametric up-converter. The output signal from the parametric amplifier or parametric up-converter as shown in the drawing can be taken from across the terminals of variable inductor 49.

Unlike the prior art parametric amplifier idler circuit described above, a second signal path (50*b*) between nodal point 60 and ground potential point 52 is provided in the idler circuit 50 of the present invention. Second signal path 50*b* includes a prior art circuit commonly referred to as a gyrator 53. Input terminal 56 of gyrator 53 is coupled to nodal point 60. Gyrator 53 is a prior art circuit capable of providing an impedance at gyrator input terminal 56 which is the inverse of the impedance terminating gyrator output terminal 57. Gyrator circuit 53 is further described by B. D. H. Tellegen in an article entitled "The Gyrator, A New Electric Element" published in Philips Research Report, Vol. 3, pp. 81–101, Apr. 1948. Second signal path 50b also includes between nodal point 60 and ground 52 a crystal filter 54 tuned to be resonant at idler frequency $f_3$. One terminal of crystal filter 54 is coupled to gyrator output terminal 57. The other terminal of crystal filter 54 is coupled to one terminal of resistor 55 whose terminal is coupled to a source of reference potential or ground 52. Resistor 55 provides a matched termination for crystal filter 54.

In operation, the magnitude of the impedance of crystal filter 54 at idler frequency $f_3$ is relatively low since crystal filter 54 is resonant at input signal frequency $f_3$. The magnitude of the impedance at gyrator input terminal 56 is relatively high at idler frequency $f_3$ since gyrator output terminal 57 is terminated by the relatively low magnitude crystal filter impedance and gyrator 53 provides the impedance inversion function previously discussed. Thus, at desired idler frequency, $f_3$, the second signal path consisting of serially connected gyrator 53 and crystal filter 54 from nodal point 60 to ground point 52 is substantially an open circuit. Inductor 47 and capacitor 48 are series resonant at idler frequency $f_3$ and variable inductor 49 is tuned at idler frequency $f_3$ to resonate with the capacitance of diodes 19 and 20.

The magnitude of the impedance of crystal filter 54 at spurious frequencies near but outside of the desirable idler frequency bandwidth is relatively high since crystal filter 54 is resonant only at idler signal frequency $f_3$. The magnitude of the impedance at gyrator input terminal 56 is relatively low at these spurious idler frequencies since gyrator output terminal 57 is terminated by the relatively high magnitude crystal filter impedance and gyrator 53 provides the impedance inversion function previously discussed. Thus, at spurious idler frequencies, the second signal path from nodal point 60 to ground point 52 is substantially a low impedance to ground detuning idler circuit 50 and causing a decrease in the Q of idler circuit 50 which results in a decrease in circulating currents at spurious idler signal frequencies.

A parametric up-converter according to the above technique has been designed and built to produce an intermediate frequency or idler frequency at 31 MHz in response to a concurrent or simultaneous application of a band of input signals from 2 to 8 MHz and a pump signal variable from 33 to 39 MHz. The following table represents typical values for the components of such a converter embodying the invention:

| | |
|---|---|
| Resistor 12 | 10 ohms |
| Resistor 13 | 220 ohms |
| Resistor 14 | 10 ohms |
| Capacitor 17 | 57 ohms |
| Resistor 21 | 870 ohms |
| Capacitor 22 | 56 micro-micro farads |
| Capacitor 31 | 0.1 micro farads |
| Resistor 25 | 2.2 megohms |
| Resistor 28 | 2.2 megohms |
| Resistor 46 | 220 ohms |
| Inductor 45 | 21 micro-henries |
| Capacitor 44 | 57 micro-micro farads |
| Inductor 43 | 6.1 micro-henries |
| Capacitor 42 | 160 micro-micro farads |
| Inductor 41 | 21 micro-henries |
| Capacitor 48 | 1–10 micro-micro farads |
| Diodes 19 and 20 | Varian Associates VA 209 |

It should be thus appreciated that the parametric amplifier circuit described includes an idler circuit 50 which substantially reduces the magnitude of circulating currents at undesirable spurious idler frequencies. One embodiment of the invention has been shown and described only by way of example. Various other embodiments and modifications thereof will be apparent to those skilled in the art, and will fall within the scope of the invention as defined in the following claims.

What is claimed is:

1. A parametric amplifier comprising:

a non-linear reactance element, means for coupling a first signal at frequency $f_1$ to said element, means for coupling a second signal at frequency $f_2$ to said element, whereby said element produces a third signal at frequency $f_3$, in response to a simultaneous coupling of said first and second signals to said element, and circuit means coupled to said element for circulating currents through said element at said third signal frequency $f_3$, said circuit means providing first and second signal paths to ground potential for said currents, said first signal path being a relatively high impedance path to ground potential at said third signal frequency $f_3$ and a relatively low impedance path to ground potential at frequencies other than frequency $f_3$, said second signal path havimg components tuned to resonate with said element.

2. A parametric amplifier according to claim 1, wherein said circuit means includes a series resonant circuit having one terminal coupled to said element and a second terminal coupled to said first and second signal paths.

3. A parametric amplifier according to claim 2, wherein said first signal path includes an impedance inverting device having an input terminal coupled to said second terminal of said series resonant circuit and an output terminal coupled to filter means resonant at said third signal frequency $f_3$.

4. A parametric amplifier according to claim 1, wherein said second signal path includes an inductor tuned to resonate with said element at said third signal frequency $f_3$.

* * * * *